United States Patent [19]

Fritzsche et al.

[11] Patent Number: 4,620,208
[45] Date of Patent: * Oct. 28, 1986

[54] HIGH PERFORMANCE, SMALL AREA THIN FILM TRANSISTOR

[75] Inventors: Hellmut Fritzsche, Chicago, Ill.; Robert R. Johnson, Franklin, Mich.

[73] Assignee: Energy Conversion Devices, Inc., Troy, Mich.

[*] Notice: The portion of the term of this patent subsequent to Oct. 15, 2002 has been disclaimed.

[21] Appl. No.: 549,996

[22] Filed: Nov. 8, 1983

[51] Int. Cl.[4] .................................. H01L 29/78
[52] U.S. Cl. ........................ 357/23.1; 357/23.7; 357/4; 357/2
[58] Field of Search ............... 357/23.7, 23.1, 2, 4

[56] References Cited

U.S. PATENT DOCUMENTS

| | | | |
|---|---|---|---|
| 3,460,005 | 8/1969 | Kanda et al. | 357/23.7 |
| 3,627,662 | 12/1971 | Feuersanger | 204/192 |
| 3,669,661 | 6/1972 | Page et al. | 430/313 |
| 3,671,820 | 6/1972 | Haering et al. | 317/235 R |
| 3,728,496 | 4/1973 | Page | 179/100.4 |
| 3,796,930 | 3/1974 | Page | 357/23.7 |
| 3,872,359 | 3/1975 | Feuersanger | 357/4 |
| 3,893,155 | 7/1975 | Ogiue | 357/42 |
| 4,062,034 | 12/1977 | Matsushita et al. | 357/16 |
| 4,065,781 | 12/1977 | Gutknecht | 357/4 |
| 4,084,175 | 4/1978 | Ouyang | 357/55 |
| 4,127,861 | 11/1978 | Deneuville | 357/15 |
| 4,160,260 | 7/1979 | Weitzel et al. | 357/23.7 |
| 4,226,898 | 10/1980 | Ovshinsky et al. | 357/2 |

FOREIGN PATENT DOCUMENTS

| | | | |
|---|---|---|---|
| 2052853 | 1/1981 | United Kingdom | 357/23.7 |
| 2067353 | 7/1981 | United Kingdom | 357/23.7 |

OTHER PUBLICATIONS

M. Shur, et al., "A New Analytical Approach to Amorphous Silicon Thin Film Transistors", Dept. of Elect. Engin., U. of Minnesota.

Primary Examiner—Andrew J. James
Assistant Examiner—William Mintel
Attorney, Agent, or Firm—Lawrence G. Norris; Robert S. Nolan; Richard O. Gray, Jr.

[57] ABSTRACT

A high performance, small area thin film transistor has a drain region, an insulating layer, and a source region at least portions of the edge of which form a non-coplanar surface with respect to a substrate. The insulative layer is formed in between the source and drain regions. A deposited semiconductor overlies the non-coplanar surface to form a current conduction channel between the drain and source. A gate insulator and gate electrode overly at least a portion of the deposited semiconductor adjacent thereto. The length of the current conduction channel is determined by the thickness of the insulative layer and therefore can be made short without precision photolithography. The non-coplanar surface can be formed by utilizing a dry process to simultaneously etch through several layers in a continuous one-step process. A second dielectric layer may be formed above the three previous layers. This decouples the gate electrode from the source region by creating two capacitances in series, thereby limiting further the capacitance between the gate electrode and the source region.

26 Claims, 16 Drawing Figures

HIGH PERFORMANCE, SMALL AREA THIN FILM TRANSISTOR

BACKGROUND OF THE INVENTION

1. Field of the Invention

The present invention relates to a high performance thin film field effect transistor which is of small area, which can be operated at high speed, and which provides high output currents. The invention more particularly relates to a thin film field effect transistor utilizing dielectric layers for providing gate electrode isolation and isolation between the source and drain regions. The dielectric layer between the source and drain also defines the current conduction channel length of the device which can be accurately controlled by the dielectric thickness.

2. Description of the Prior Art

Thin film field effect transistors generally comprise source and drain electrodes interconnected by a semiconductor material. Conduction between the electrodes takes place primarily within the semiconductor through a current conduction channel between the source and drain electrodes. The current flow between the electrodes is controlled by the application of a voltage to a gate which is adjacent at least a portion of the semiconductor and is insulated therefrom.

There are many applications wherein it is desirable to have a thin film field effect transistor capable of providing relatively high output currents and operating at relatively high speeds. One such application is in large area liquid crystal displays wherein the transistors are called upon to drive the individual pixels of the displays. The current required to drive these displays is directly related to the display area while the required device speed is directly related to the number of pixels forming the display.

In thin film field effect transistors, the device output current and operating speed is largely dependent upon the length of the current conduction channel between the source and drain. More particularly, the output current is inversely proportional to the channel length and the operating frequency is inversely proportional to the square of the channel length. Hence, if the channel length of a device can be reduced from 10 microns to 1 micron, the output current could be increased ten times and the operating speed could be increased one hundred times. In addition, if the channel length could be decreased as above, the width of the device could be decreased. For example, typical planar thin film field effect transistors have a channel length of 10 microns, a width of about 500 microns and provide output current of about 10 microamps. If the channel length of that device could be reduced to one micron, that same 10 microamps of current could be provided by a device only 50 microns wide. Hence, the total area of the device could be reduced by a factor of ten and thus the packing density could be increased by a factor of ten. By reducing the device area by one-tenth, the capacitance of the device can also be reduced by a factor of ten. Further, the resulting device, while providing the same current and occupying one-tenth the area, could also exhibit an operating frequency one hundred times higher than the original thin film field effect transistors having the ten micron channel.

Unfortunately, the channel length in conventional thin film field effect transistors cannot be readily reduced from the standard channel length of ten microns to a channel length of one micron. The reason for this is that the channel length is determined by the spacing between the drain and source electrodes. Conventional large area photolithography, the process by which the device structures are formed across 12 inch distances, has a feature size of ten microns. Hence, with conventional photolithography, as used for large areas the minimum channel length obtainable is ten microns.

More precise photolithography having feature sizes down to about one micron are known. However, this precision process is difficult to perform and the equipment necessary to practice it is extremely expensive. In addition, the one micron feature size cannot be maintained over large areas. As a result, while channel lengths in conventional thin film field effect transistors can be reduced to about one micron in the laboratory, it is expensive and cannot be provided over large areas such as is required in large area liquid crystal flat panel displays. This makes precision photolithography virtually useless in commercial applications such as liquid crystal flat panel display where one hundred percent yield over large areas is essential.

To overcome these deficiencies in prior art thin film transistor structures, a new and improved thin film field transistor has been proposed. This improved transistor is disclosed and claimed in commonly assigned copending U.S. application Ser. No. 529,299 for Thin Film Transistor filed in the names of Richard A. Flasck, et al. The transistor therein disclosed includes source and drain regions vertically displaced with respect to each other relative to a substrate and having a channel formed therebetween, the length of which is a function of the vertical displacement distance between the source and drain and which is substantially independent of the constraints otherwise imposed by horizontal lithography.

The present invention provides a new and improved thin film field effect transistor device structure of the foregoing type wherein extremely short channel lengths can be provided without the need for precise photolithography and where short channel lengths can be accurately controlled and maintained over large areas.

SUMMARY OF THE INVENTION

The present invention is an improvement in thin film field effect transistors of the general type described in the aforementioned U.S. application Ser. No. 529,299. The transistor is capable of providing improved high performance. It can provide high output current for the purpose of driving displays and can be operated at high frequencies. The transistors of the present invention can be made small to increase the packing densities of the devices while still allowing for the formation of short current conduction channels without the need for precision alignment or photolithography.

Generally, the thin film, field effect transistor of the invention is formed on a substantially horizontal substrate and includes a substantially horizontal drain region, a substantially horizontal source region, a gate insulator and a gate electrode. More particularly, the transistor includes a plurality of substantially horizontal layers vertically arrayed with respect to the substrate and above one another with respect to the substrate i.e., the source region, the drain region and an insulating layer between the drain and source regions at least portions of the edges of which form a substantially non-horizontal surface with respect to the substrate i.e.

a non-coplanar surface. The transistor is formed by a deposited semiconductor material overlying a diagonal or non-coplanar surface connecting electrically the source region and the drain region to form a current conduction channel between the source region and the drain region. The gate insulator is disposed over at least a portion of the deposited semiconductor material to separate the gate electrode from the semiconductor material.

In accordance with a preferred embodiment of the present invention, the insulating layer between the source region and the drain region is formed from a dielectric material with a high breakdown voltage such as silicon oxide. The source region, the dielectric layer, and the drain region form a surface which is non-coplanar or non-parallel with respect to the substrate. The thin film deposited amorphous semiconductor material layer is preferably formed from an amorphous silicon alloy and is disposed over the dielectric layer and a portion of both the source region and the drain region. A semiconducting channel is thereby formed in the amorphous semiconductor material layer between the source region and the drain region having a length determined by the thickness of the dielectric layer. The gate insulator is preferably formed from a dielectric material such as silicon oxide. The gate electrode is formed in contact with at least a portion of the gate insulator adjacent to the semiconducting channel.

In accordance with another embodiment of the present invention a further dielectric layer is formed over the source region. This further dielectric layer serves to decouple the gate electrode from the source to decrease the gate capacitance of the device and therefore further enhance its high frequency performance.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numbers identify identical elements and wherein:

DESCRIPTION OF THE PREFERRED EMBODIMENTS

Figure 1:
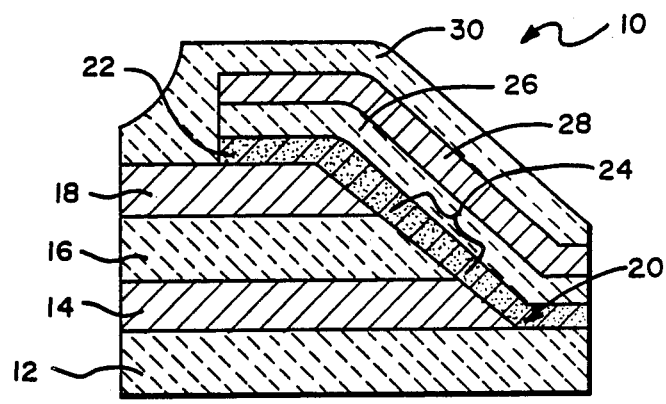
FIG. 1 is a cross-sectional side view of a thin film, field effect transistor embodying the present invention.

Referring now to FIG. 1, it illustrates a thin film field effect transistor 10 made in accordance with the teachings of the present invention. As shown, the transistor 10 is formed on a substrate 12 of insulating material which could be glass, single crystalline silicon, mylar, or an insulator on top of a metal, such as a dielectric overlying a stainless steel surface. Deposited on the substrate 12 in accordance with the teachings of the present invention is a first layer 14 of conductive drain metal, most commonly a drain layer. On top of drain metal layer 14 is a layer 16 of insulating material. The insulating material is preferably of a dielectric material. The dielectric material can be silicon oxide ($SiO_x$), silicon nitride ($Si_xN_y$), silicon oxy-nitride ($SiO_xN_y$) or aluminum oxide ($Al_2O_3$).

A second layer 18 of conductive metal, most commonly a source layer is deposited over the insulative layer 16. The source metal 18 and drain metal 14 can be formed of any suitable conductive metal, such as aluminum, molybdenum or molybdenum tantalum alloy such as ($Mo_{0.975}Ta_{0.025}$). Other suitable metals are chrome, titanium tungsten (TiW), palladium and platinum. Once layers 14, 16 and 18 have been deposited, all of the layers can be etched in one continuous step, in accordance with the teachings of the present invention, in order to create a non-coplanar surface 20, substantially non-horizontal with respect to the substrate 12 and the stacked layers 14 and 16. The non-coplanar or diagonal surface 20 is defined by the exposed edge portions of the source layer 18, the insulative layer 16, and the drain layer 14. As used herein, a non-coplanar surface is meant to be a surface which defines one or more planes which are non-parallel to the substrate although it may include minor plane portions which are parallel to the substrate.

A layer of semiconductor material 22 between 100 and 10,000 Å in thickness and preferably about 2,000 Å is deposited over the non-coplanar surface 20 and a portion of source layer 18. The semiconductor material is preferably an amorphous silicon alloy including hydrogen, or fluorine, or hydrogen and fluorine. The deposited semiconductor material can also be a polycrystalline silicon alloy. The semiconductor material 22 is electrically coupled to the source 18 and drain 14 and therefore, a short current conduction channel 24 results in the semiconductor material layer 22 between source layer 18 and drain layer 14. A gate insulator layer 26 of insulating material is then deposited over a portion of the amorphous semiconductor material layer 22. The gate insulator is preferably a dielectric such as silicon oxide or silicon nitride. In a preferred exemplification, the portion of the semiconductor material layer 22 adjacent the source 18 is greater in thickness than the portion forming the current conduction channel 22. This provides some decoupling between the gate and source and therefore improves the high frequency characteristics of the device.

On the gate insulator layer 26 is deposited a gate electrode or conductor 28 which can be made of any suitable metal such as aluminum, molybdenum, chrome or molybdenum tantalum alloy, for example. The gate electrode 28 is formed over a portion of the gate insulator 26 and adjacent to the current conduction channel 24. Finally, a passivating layer 30, such as an oxide or polymer, is formed over the device. The source metal 18 and the drain metal 14 can typically have thicknesses ranging from 1,000 to 3,000 Å, with the thickness preferably being 2,500 Å. The insulative layer 16 can typically have a thickness between 0.5 to 3 microns, preferably about 0.8 microns, and the gate insulator layer 26 can typically have a thickness of between 300 to 5,000 Å, and preferably 2,000 Å.

In constructing the thin film, field effect transistor 10 shown in FIG. 1, the layers of material can be deposited by various deposition techniques, such as sputtering and plasma enhanced chemical vapor deposition. The non-coplanar surface 20 can be formed by a dry process that simultaneously etches through the three layers in a continuous one-step process. The process will be explained subsequently in further detail.

Figure 2:
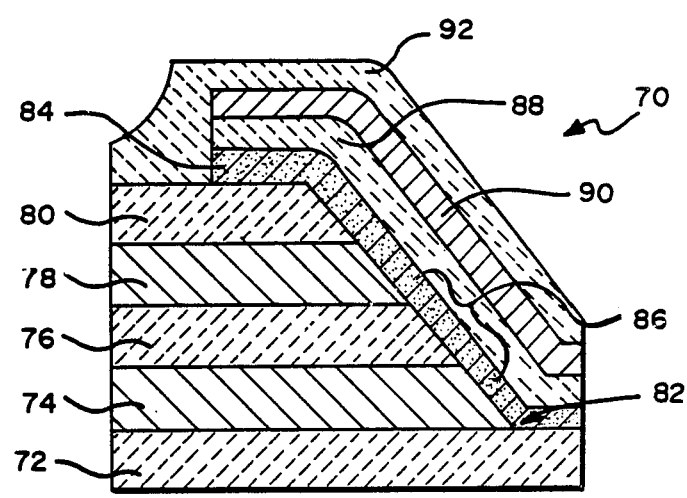
FIG. 2 is a cross-sectional side view of another thin film, field effect transistor embodying the present invention.

In FIG. 2 there is illustrated another thin film, field effect transistor 70 made in accordance with the teachings of the present invention. On an insulating substrate 72 is first deposited a layer of drain metal 74. On top of the drain metal 74 is deposited a layer 76 of insulating material. On top of the insulating layer 76 is formed a layer of source metal 78. On top of the source layer 78 is formed a second layer 80 of insulating material having a thickness between about 0.5 to 1.5 microns. Once layers 74, 76, 78 and 80 have been deposited, a noncoplanar surface 82 with respect to substrate 72 is formed in accordance with the teachings of the present invention.

After forming surface 82, a layer of semiconductor material 84 is formed over the surface 82 and over a portion of second insulating layer 80. A short current conduction channel 86 results in the semiconductor material layer 84 between the drain layer 74 and the source layer 78. A gate insulator layer 88 is then formed over the semiconductor material layer 84. Finally, a gate electrode 90 is formed over a portion of the gate insulator layer 88 adjacent to the current conduction channel 86.

The insulating layer 76 is preferably made of a dielectric material such as silicon oxide, silicon nitride, or aluminum oxide. The second insulating layer 80 is also of a dielectric material, preferably silicon oxide or silicon nitride. The source layer 78 and the drain layer 74 are preferably formed from a metal such as aluminum or molybdenum by sputtering. In addition, the layer of semiconductor material is deposited on surface 82 by using glow discharge decomposition techniques. A top oxide or polymer passivating layer 92 can also be formed over the device.

The thin film, field effect transistor of the present invention and the various specific embodiments thereof described herein provide high performance and small area thin film transistors. The top passivating or insulating layer of the transistors, such as layers 30 and 92 in FIGS. 1 and 2, can be utilized to form an insulating layer for another transistor to be formed thereon to provide a stacked transistor configuration to further increase the packing density of the devices.

The transistor 10 of FIG. 1 can be made in accordance with the invention disclosed and claimed in copending U.S. application Ser. No. 549,991 filed concurrently herewith for Method of Making a High Performance, Small Area Thin Film Transistor, which application is also assigned to the assignee of the present invention.

Figure 3A:
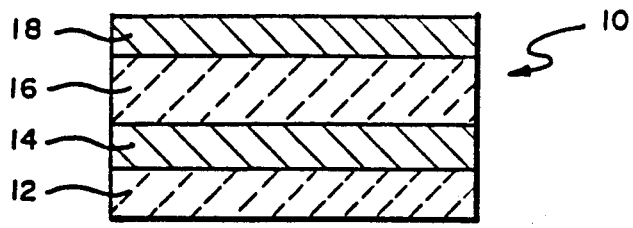
FIGS. 3A–3I are a series of cross-sectional side views illustrating a method of making the thin film, field effect transistor illustrated in FIG. 1.

The method is illustrated in the series of views in FIGS. 3A-3I. FIG. 3A illustrates a glass substrate 12 made of 7059 series glass having three layers deposited thereon. The layers consist of a drain layer 14 preferably made of molybdenum, an insulating layer 16 preferably made of silicon oxide, and a source layer 18 preferably made of molybdenum. The drain and source layers are deposited by sputtering and the insulating layer is deposited by plasma enhanced chemical vapor deposition. The drain and the source layers preferably have thicknesses of 2,500 Å and the insulating layer preferably has a thickness of about 0.8 microns.

Figure 3B:
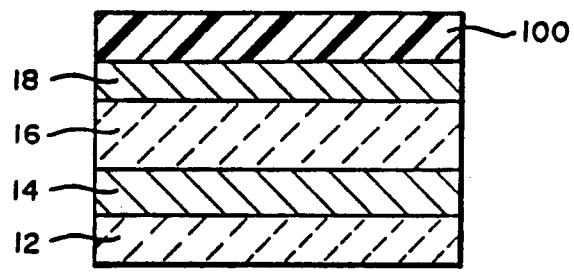
Figure 3C:
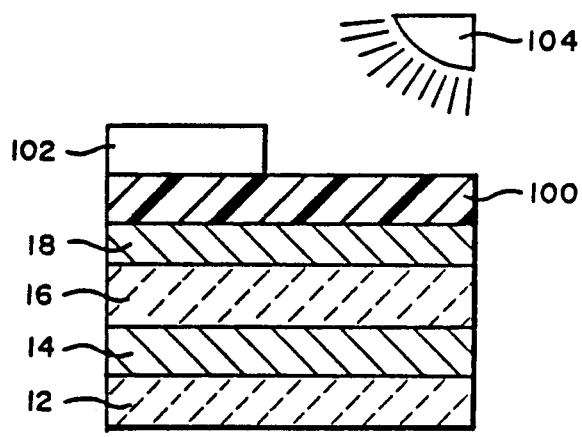

In FIG. 3B, a layer of positive photoresist 100 having a thickness of about 3 to 3.5 microns is deposited over the source layer 18. The positive photoresist 100 is deposited by using a spin coating method and the positive photoresist is, for example, Shipley's p-type AZ 1350J. In FIG. 3C, a mask 102 is placed over a portion of the positive photoresist layer 100. The unmasked portion of layer 100 is then exposed to a collimated light source 104 having an intensity of 300 millijoules/cm$^2$ for a period of 16 seconds. Actually, the layer 100 is underexposed by about 20% since the normal intensity of exposure is 360 millijoules/cm$^2$ for 16 seconds.

After exposure, mask 102 is removed and the positive photoresist layer 100 is actively developed. For example, one part of Shipley developer AZ-311 is used along with three parts water to create an active developer solution. Only the exposed portions of the positive photoresist layer 100 are soluble to the active developer solution. Since the positive photoresist is eroded during this process, the coating thickness of the positive photoresist can be critical. In order to etch a 2 micron wide channel with a photoresist mask, a 3 to 3.5 micron thick photoresist is preferred.

Figure 3D:
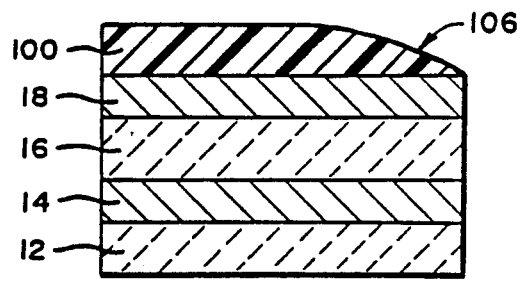
Figure 3E:
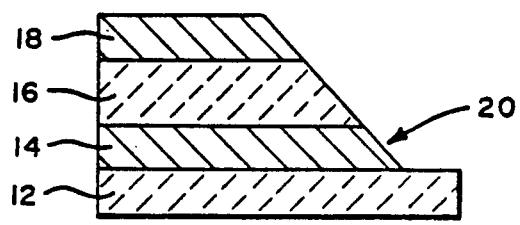

As illustrated in FIG. 3D, after developing the positive photoresist layer 100, a tapered surface 106 results on a portion of layer 100. The tapered surface 106 will serve as a mask for the three layers below the positive photoresist layer 100 when the device is subjected to a plasma etching process. FIG. 3E illustrates the structure that results after plasma etching wherein a noncoplanar surface 20 with respect to the substrate 12 is formed.

Plasma etching is a process by which gases are used to produce anisotropic etches on various layers of a particular device in order to create a particular profile. In practicing the present invention, gases which can be used in the plasma etching include sulfur hexafluoride ($SF_6$), carbon tetrafluoride ($CF_4$) and oxygen ($O_2$). The flow rates for these gases preferably are: 50 SCCM (standard cubic centimeters per minute) for $SF_6$; 100 SCCM for $CF_4$; and 10 SCCM for $O_2$. The chamber pressure is between 50 to 300 microns of mercury and the temperature is preferably close to room temperature (20° to 23° C.). The radio frequency power is preferably about 1,000 to 2,000 watts having a frequency of 13.56 MHz. The electrode size is, for example, 6×6 inches and the electrode spacing can be between 3/16 inch to 2 inches. The power density for such a system is therefore between about 10 and 20 watts/cm$^3$.

In the present process, fluorinated carbon gases are used to etch the composite structure illustrated in FIG. 3E. $CF_3$ radicals are the primary etch species for the silicon oxide ($SiO_2$). The etching mechanism where the oxide is $SiO_2$ and the metal is molybdenum is as follows:

$$CF_a + SiO_2 \rightarrow SiF_b + CO, CO_2$$

$$CF_a + MO \rightarrow MOF_b + CO, CO_2$$

The addition of oxygen ($O_2$) to the process prevents the polymer buildup on the chamber walls and on the substrate that slows down the etch rate. Sulfur hexafluoride ($SF_6$) as one of the gases in the plasma etching process is preferred because, while fluorinated gases do produce anisotropic etches, only vertical profiles would result. Sulfur hexafluoride selectively erodes the photoresist at a faster rate than the metal, therefore a sloped profile is maintained. FIG. 3E illustrates the sloped profile obtained by this process. Finally, photoresist layer 100 and the drain layer 14, insulating layer 16, and source layer 18 are subjected to plasma etching for a period of 10 to 12 minutes. Any positive photoresist remaining after this process is removed in order to allow for proper deposition of other layers above the etched surface.

Figure 3F:
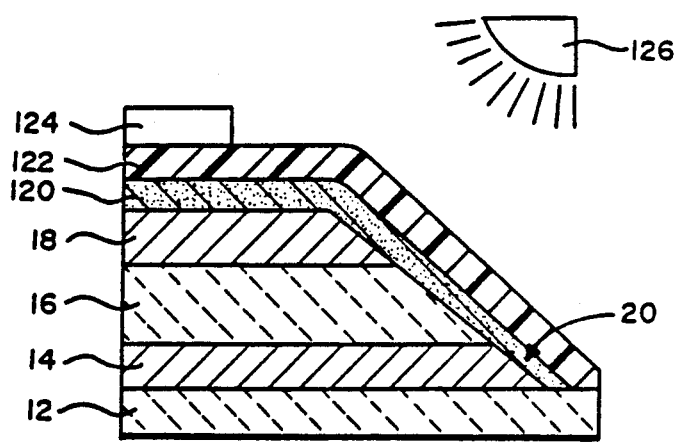

Referring now to FIG. 3F, a layer of semiconductor material 120 is formed by plasma assisted chemical vapor deposition i.e. glow discharge as disclosed, for example, in U.S. Pat. No. 4,226,898 which issued on Oct. 7, 1980 in the names of Stanford R. Ovshinsky and Arun Madan for Amorphous Semiconductors Equivalent To Crystalline Semiconductors Produced By A Glow Discharge Process, over the non-coplanar surface 20 and the source layer 18. The purpose of the following steps is to form the semiconductor layer 120 so that it covers the non-coplanar surface 20 and a portion of the source layer 18 of the device.

Figure 3G:
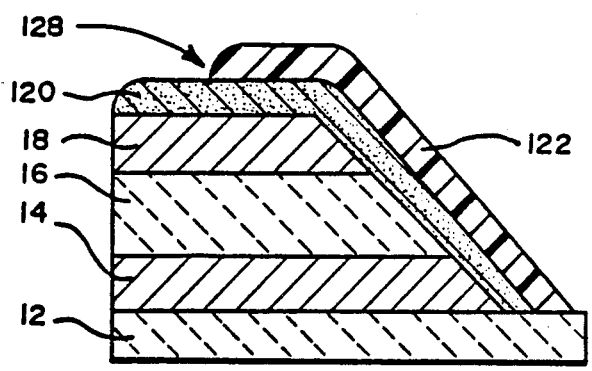
Figure 3H:
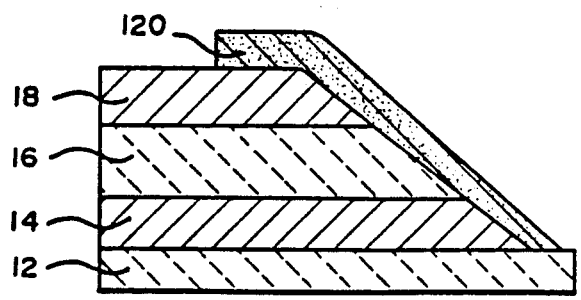

A negative photoresist layer 122 is formed over the amorphous semiconductor material layer 120. A mask 124 is then placed over a portion of the negative photoresist layer 122. As illustrated in FIG. 3F, a light source 126 illuminates the exposed portions of the negative photoresist layer 122. The photoresist layer 122 is exposed by using a light having an intensity of 300 millijoules/cm$^2$. Due to the use of a negative photoresist, the exposed portions harden and become insoluble to an active developer solution. The unexposed portions are soluble to that particular solution. FIG. 3G illustrates the removed portion 128 of the photoresist that results after the photoresist layer 122 has been actively developed. FIG. 3H illustrates the amorphous semiconductor material layer 120 after being subjected to etching in a conventional manner and after the hardened portion of the photoresist has been removed.

Figure 3I:
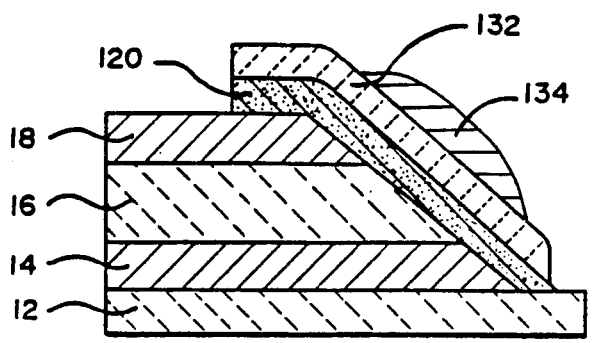

FIG. 3I illustrates the completed device after subsequent processing. A gate insulator layer is originally deposited over the entire device including the amorphous semiconductor material layer 120. After a portion of the gate insulator layer is etched by conventional techniques, a gate insulator 132 results. Once the gate insulator 132 has been formed, a gate electrode 134 is formed over the device by sputtering or evaporation. Conventional etching techniques are again used to form the gate electrode 134. Although separate etching steps for the amorphous semiconductor material, the gate insulator, and the gate electrode are disclosed herein, these layers can also be etched together in a one mask exposure, single etch process.

Figure 4A:
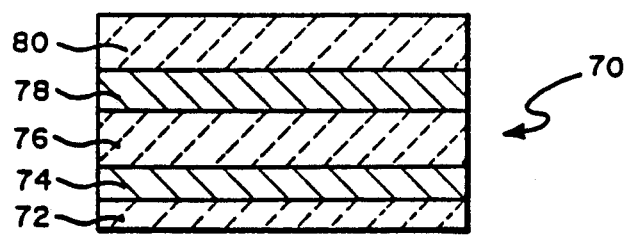
FIGS. 4A–4E are cross-sectional side views illustrating a method of making the thin film, field effect transistor illustrated in FIG. 2.
Figure 4B:
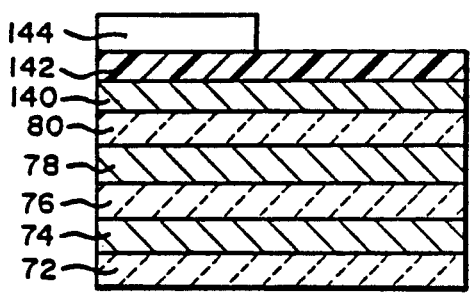

The method of making the transistor as illustrated in FIG. 2 in accordance with the invention of the above-mentioned copending application Ser. No. 549,991, is shown in FIGS. 4A-4E. As shown in FIG. 4A, the drain layer 74, insulating layer 76, source layer 78, and second insulating layer 80 are formed in succession over the insulating substrate 72. In order to etch through the drain layer 74, insulating layer 76, source layer 78 and the second insulating layer 80, a layer of aluminum 140 is formed over the insulating layer 80 of the metal-oxide-metal-oxide structure as shown in FIG. 4B.

Figure 4C:
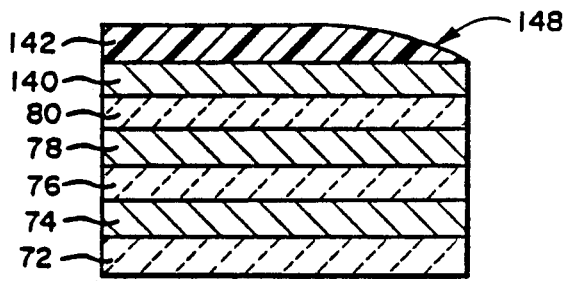
Figure 4D:
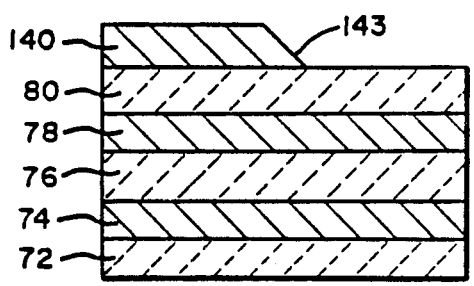
Figure 4E:
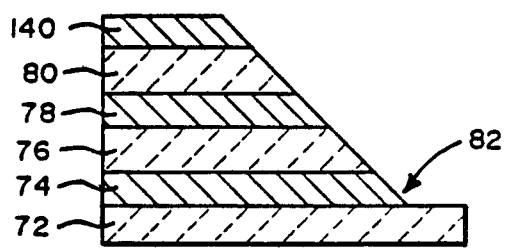

As illustrated in FIG. 4B, a layer of positive photoresist 142 is formed over the aluminum layer 140. The aluminum has a thickness of between 1,000 and 3,000 Å, preferably 1,500 Å. The photoresist has a thickness of between 1.5 to 3 microns, preferably 2 microns. A mask 144 is then placed over a portion of the positive photoresist layer 142. The positive photoresist layer 142 is then underexposed by using a light source 146 having the intensity of 300 millijoules/cm$^2$. Mask 144 is then removed and the photoresist layer 142 is actively developed. FIG. 4C illustrates the tapered surface 148 that results once layer 142 has been overdeveloped using an active developer solution as previously described. The configuration of FIG. 4C is then subjected to an etching solution consisting of one part de-ionized water (Di-H$_2$O), one part nitric acid (HNO$_3$), three parts acetone (CH$_3$OOH) and fifteen parts phosphoric acid (H$_3$PO$_4$). The etching solution will etch through the photoresist layer 142 and a portion of the aluminum layer 140. The tapered surface 148 in FIG. 4C serves as a mask to create a tapered surface 143 in the aluminum layer 140 as illustrated in FIG. 4D. The etched layer of aluminum 140 can now serve as a mask during plasma etching, preferably as described earlier. The structure shown in FIG. 4E results once the plasma etching is complete. As can be noted, the layers 74, 76, 78 and 80 now form a surface 82 which is diagonal with respect to the substrate. The layer of aluminum 140 is then removed and the device is completed as described with respect to FIGS. 3F-3I.

With respect to the devices of FIGS. 1 and 2, it is important to remember that the thickness of the semiconductor material layers 22 and 84 is preferably greater between the uppermost layer of the structure and the gate insulator and thinner between the source and drain regions. The uppermost insulating layer 80 of the device of FIG. 2 is formed to decouple the gate electrode 90 from the source region 80 by creating two capacitances in series. This diminishes the overall capacitance between the gate electrode 90 and the source region 80. The non-coplanar surfaces illustrated in FIGS. 1 and 2 can take many different profiles and are therefore not limited to, "V-shape" or diagonal type surfaces with respect to the substrate. It is therefore to be understood that within the scope of the appended claims the invention can be practiced otherwise than as specifically described.

What is claimed and desired to be secured by Letters Patent of the United States is:

1. A thin film field effect transistor of the type formed on a substantially planar substrate, said transistor comprising:

a plurality of layers, said plurality of layers being formed over said substrate so as to have faces substantially parallel to said substrate to form a source region layer, a drain region layer, and an electrically insulating layer between said source and drain regions layers, said layers having edge portions forming a substantially planar surface which is non-parallel to said substrate; a deposited semiconductor material layer overlying said non-parallel surface between and electrically coupled to said source region layer and said drain region layer along said non-parallel surface for forming a current conduction channel therebetween; a gate insulator disposed over said deposited semiconductor material layer and a gate electrode separated from said deposited semiconductor material layer by said gate insulator.

2. The thin film field effect transistor according to claim 1 wherein said deposited semiconductor material layer includes silicon.

3. The thin film field effect transistor according to claim 1 wherein said deposited semiconductor material layer is an amorphous semiconductor alloy.

4. The thin film field effect transistor according to claim 3 wherein said amorphous semiconductor alloy includes silicon and fluorine.

5. The thin film field effect transistor according to claim 3 wherein said amorphous semiconductor alloy contains silicon and hydrogen.

6. The thin film field effect transistor according to claim 3 wherein said amorphous semiconductor alloy is $Si_aF_bH_c$ wherein a is between 80 and 98 an atomic percent, b is between 1 and 10 in atomic percent and c is between 1 and 10 in atomic percent.

7. The thin film effect transistor according to claim 1 wherein said drain region layer is formed from a metal.

8. The thin film field effect transistor according to claim 1 wherein said source region layer is formed from a metal.

9. The thin film field effect transistor according to claim 1 wherein said gate electrode is formed from a metal.

10. The thin film field effect transistor according to claim 1 wherein said drain region layer has a thickness of between 1,000 and 3,000 Angstroms.

11. The thin film field effect transistor according to claim 1 wherein said source region layer has a thickness of between 1,000 and 3,000 Angstroms.

12. The thin film field effect transistor according to claim 1 wherein said deposited semiconductor material layer has a thickness of between 100 and 10,000 Angstroms.

13. The thin film field effect transistor according to claim 1 wherein said gate insulator has a thickness of between 300 and 5,000 Angstroms.

14. The thin film field effect transistor according to claim 1 wherein said substrate is made of glass.

15. The thin film field effect transistor according to claim 1 further including a passivating layer overlying said transistor.

16. The thin film field effect transistor according to claim 1 wherein said drain region layer is made of a semiconductor alloy.

17. The thin film field effect transistor according to claim 1 wherein said source region layer is made of a semiconductor alloy.

18. The thin film field effect transistor according to claim 1 wherein said non-parallel surface is a diagonal surface with respect to said substrate.

19. The thin film field effect transistor according to claim 1 wherein said source region layer is located above said drain region.

20. The thin film field effect transistor according to claim 1 wherein said insulating layer has a thickness of between 0.5 and 3 microns.

21. The thin film field effect transistor according to claim 1 wherein said insulating layer is made of silicon oxide.

22. The thin film field effect transistor according to claim 1 wherein said plurality of layers includes a second insulating layer disposed above said source region.

23. The thin film field effect transistor according to claim 22 wherein said second insulating layer is formed from silicon oxide.

24. The thin film field effect transistor according to claim 22 wherein the thickness of said second insulating layer is between 1,000 and 3,000 Angstroms.

25. The thin film field effect transistor as defined in claim 1 wherein the portion of said deposited semiconductor material adjacent said source region is greater in thickness than the portion including said current conduction channel.

26. In a thin film, field effect transistor of the type formed on a substrate, said transistor including a drain region, a source region, a gate insulator, and a gate electrode, the improvement comprising: said drain region formed on said substrate; a dielectric layer formed over at least a portion of said drain region; said source region formed over at least a portion of said dielectric layer; at least one diagonal cut across said source region, said dielectric layer and said drain region forming a diagonal surface with respect to said substrate; a thin film deposited amorphous semiconductor material layer in contact with said diagonal surface and disposed over at least said dielectric layer and a portion of said source region and said drain region, and forming a current conduction channel between said source region and said drain region; said gate insulator overlying said amorphous semiconductor material layer; and said gate electrode overlying at least a portion of said gate insulator adjacent to said current conduction channel.

* * * * *